(12) United States Patent
Abe et al.

(10) Patent No.: US 8,134,381 B2
(45) Date of Patent: Mar. 13, 2012

(54) CONNECTION BOARD, PROBE CARD, AND ELECTRONIC DEVICE TEST APPARATUS COMPRISING SAME

(75) Inventors: Yoshihiro Abe, Tokyo (JP); Takaji Ishikawa, Tokyo (JP); Noriaki Shimasaki, Tokyo (JP); Shigeru Matsumura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/532,688

(22) PCT Filed: Mar. 18, 2008

(86) PCT No.: PCT/JP2008/054992
§ 371 (c)(1),
(2), (4) Date: Sep. 23, 2009

(87) PCT Pub. No.: WO2008/123076
PCT Pub. Date: Oct. 16, 2008

(65) Prior Publication Data
US 2010/0102837 A1 Apr. 29, 2010

(30) Foreign Application Priority Data
Mar. 26, 2007 (JP) .................. 2007-079194

(51) Int. Cl.
*G01R 31/00* (2006.01)
(52) U.S. Cl. ......... 324/756.07; 324/756.03; 324/754.07; 324/762.05
(58) Field of Classification Search ............. 324/754.07, 324/756.01–756.07, 762.01, 762.05
See application file for complete search history.

(56) References Cited

U.S. PATENT DOCUMENTS

| | | | |
|---|---|---|---|
| 5,808,475 A * | 9/1998 | Knauer et al. ................ 324/762 |
| 6,600,329 B2 * | 7/2003 | Lee ................................. 324/754 |
| 6,815,961 B2 | 11/2004 | Mok et al. |
| 7,400,156 B2 * | 7/2008 | Wu et al. .................. 324/754.12 |
| 7,595,651 B2 * | 9/2009 | Ku et al. .................. 324/755.07 |
| 2002/0043970 A1 | 4/2002 | Lee |
| 2003/0057976 A1 * | 3/2003 | Deguchi ........................ 324/754 |
| 2005/0156611 A1 * | 7/2005 | Shinde et al. ................. 324/754 |
| 2005/0156613 A1 * | 7/2005 | Hosaka ......................... 324/754 |
| 2006/0255814 A1 * | 11/2006 | Eldridge et al. .............. 324/754 |
| 2007/0108996 A1 * | 5/2007 | Amemiya et al. ............ 324/754 |
| 2007/0126443 A1 * | 6/2007 | Grube et al. .................. 324/754 |
| 2007/0182430 A1 * | 8/2007 | Ismail et al. .................. 324/754 |
| 2008/0180120 A1 * | 7/2008 | Kim et al. ..................... 324/754 |

(Continued)

FOREIGN PATENT DOCUMENTS
CN 1645589 7/2005
(Continued)

OTHER PUBLICATIONS

English language Abstract of JP 11-295342, Oct. 29, 1999.
(Continued)

*Primary Examiner* — Arleen M Vazquez
(74) *Attorney, Agent, or Firm* — Greenblum & Bernstein, P.L.C.

(57) ABSTRACT

A probe card is provided which includes: probe needles electrically contacting input/output terminals of an IC device formed on a semiconductor wafer W; a mount base on which the probe needles are mounted; a support column supporting the mount base, a circuit board having interconnect patterns electrically connected to the probe needles via bonding wires; and a base member and stiffener for reinforcing the probe card. The mount base and the circuit board are noncontact.

11 Claims, 12 Drawing Sheets

U.S. PATENT DOCUMENTS

2008/0258745 A1 10/2008 Hosaka
2009/0009198 A1* 1/2009 Ku et al. ............... 324/754

FOREIGN PATENT DOCUMENTS

| JP | 11-295342 | 10/1999 |
| JP | 2006-507479 | 3/2006 |
| KR | 2002-30906 | 4/2002 |
| KR | 2006-126773 | 12/2006 |
| KR | 2006-127938 | 12/2006 |
| WO | 2005/069019 | 7/2005 |

OTHER PUBLICATIONS

China Office action, mail date is May 6, 2011.

* cited by examiner

BEFORE HEAT
EXPANSION

AT START OF HEAT EXPANSION

CONNECTION BOARD, PROBE CARD, AND ELECTRONIC DEVICE TEST APPARATUS COMPRISING SAME

TECHNICAL FIELD

The present invention relates to a connection board for electrically connecting a semiconductor integrated circuit device or other various types of electronic devices (hereinafter also referred to representatively as an "IC device") and a test apparatus when testing an IC device by a test apparatus, and probe card and electronic device test apparatus comprising the same.

BACKGROUND ART

In the process of production of an IC device or other electronic device, an electronic device test apparatus is used for testing the performance and functions of an IC device in a state built into the semiconductor wafer and in a packaged state.

As the electronic device test apparatus 1' for testing the electrical characteristics of an IC device formed in a semiconductor wafer W, as shown in FIG. 8, one which pushes a wafer W by a prober 80 against a probe card 50', brings probe needles 60' mounted on the probe card 50' into electrical contact with the input/output terminals of an IC device, and tests the electrical characteristics of the IC device by a tester (not shown) through the probe card 50' and test head 10 has been known in the past.

This test is performed in the state applying thermal stress to the wafer W by heating a prober stage 83 holding the wafer W under test. Along with the application of this thermal stress, the probe card 50' also rises in temperature and expands due to the heat.

The board 55' on which the probe needles 60' are mounted in the probe card 50' is, for example, made of a glass epoxy resin or another material with a larger coefficient of thermal expansion than the semiconductor wafer W. Further, as shown in the same figure, the probe card 50' is fixed to a top plate 81 of the prober 80 at its peripheral edges via a card holder 70.

For this reason, if thermal stress is applied to the wafer W, as shown in FIG. 9A to FIG. 9C, the board 55' of the probe card 50' expands due to heat and deforms in the vertical direction whereby the front end positions of the probe needles 60' move in the vertical direction. Due to this, the needle pressure (contact pressure) by which the probe needles 60' contact the input/output terminals of an IC device changes, so the electrical characteristics between the probe needles 60' and the input/output terminals of an IC device end up changing and high precision tests cannot be performed in some cases.

Further, if the board 55' on which the probe needles 60' are mounted in the probe card 50' expands due to heat, sometimes positional deviation occurs between the probe needles 60' and the input/output terminals of an IC device and the probe needles 60' end up missing contact with the input/output terminals.

SUMMARY OF INVENTION

Technical Problem

The problem to be solved by the present invention is to provide a connection board, probe card, and an electronic device test apparatus comprising the same enabling a device under test to be tested accurately and with a high precision.

Solution to Problem

To achieve the above object, according to the present invention, there is provided a connection board for electrically connecting a device under test and an electronic device test apparatus when testing the device under test, the connection board comprising: contactors for electrical connection with input/output terminals of the device under test; a first board on which the contactors are mounted; and a second board having interconnect patterns electrically connected with the contactors, wherein the first board and the second board are non-contact.

While not particularly limited in the invention, preferably the first board has a relatively small coefficient of thermal expansion compared with the second board.

While not particularly limited in the invention, preferably the first board has a relatively large coefficient of thermal expansion rate compared with the semiconductor substrate on which the device under test is formed.

While not particularly limited in the invention, preferably the first board is composed of a ceramic board.

While not particularly limited in the invention, preferably the connection board further comprising: a support member supporting the first board; and a reinforcing member for reinforcing the connection board, wherein the support member is fixed to the reinforcing member.

While not particularly limited in the invention, preferably a first through hole is formed at the second board and runs through from the front surface to the back surface, one end of the support member is fixed to the first board, and the other end of the support member is fixed through the first through holes to the reinforcing member.

While not particularly limited in the invention, preferably the connection board further comprising a deformation suppressing member for suppressing deformation of the first board to the second board side.

While not particularly limited in the invention, preferably a second through hole is formed at the second board and runs through from the front surface to the back surface, one end of the deformation suppressing means is positioned in the vicinity of the first board, and the other end of the deformation suppressing member is fixed through the second through holes to the reinforcing member.

While not particularly limited in the invention, preferably a through hole is formed at the first board and runs through from the front surface to the back surface, and the contactors and the interconnect patterns of the second board are electrically connected via bonding wires passing through the through hole.

While not particularly limited in the invention, preferably the second board has a connector electrically connected to the electronic device test apparatus.

While not particularly limited in the invention, preferably the board further comprising: a third board having a connector electrically connected to the electronic device test apparatus; and a intermediate board electrically connecting the second board and the third board in a detachable manner.

To achieve the above object, according to the present invention, there is provided a probe card using any of the above connection boards, wherein the device under test is a semiconductor device formed on a semiconductor wafer, and the contactors are probe needles mounted on the front surface of the first board and electrically connecting with input/output terminals of the semiconductor device.

To achieve the above object, according to the present invention, there is provided an electronic device test apparatus for testing a semiconductor device formed on a semiconductor wafer, the electronic device test apparatus comprising: the above probe card; a test head electrically connected to the probe card; and a prober moving the semiconductor wafer relative to the probe card.

Advantageous Effects of Invention

In the present invention, the board on which the contactors are mounted and the board on which the interconnect patterns are formed are separate. Further, the first board on which the contactors are mounted and the second board on which the circuit patterns are formed are noncontact. Due to this, even if the second board deforms due to heat expansion etc., the deformation is not transmitted to the first board, and fluctuation in contact pressure or positional deviation of the contactors can be suppressed, so accurate tests can be performed with a high precision.

REFERENCE SIGNS LIST

Figure 1:
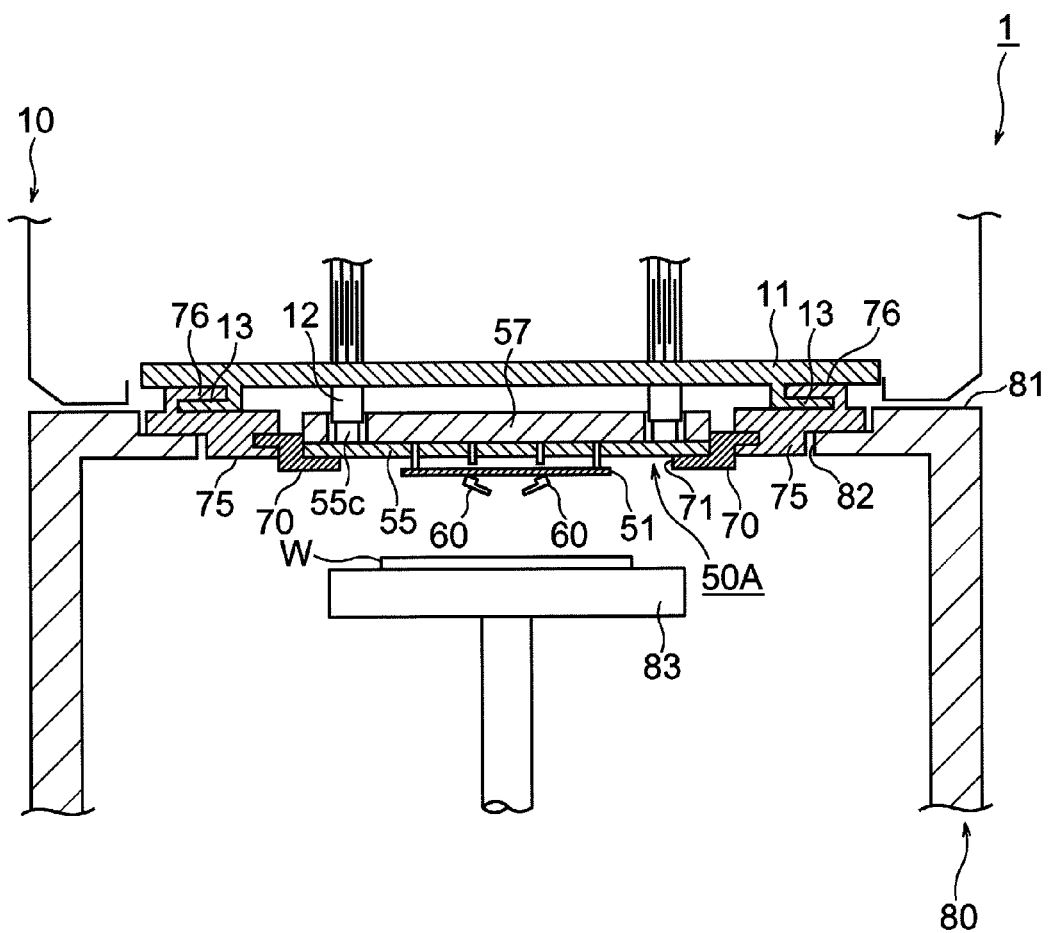
FIG. 1 is a schematic cross-sectional view of an electronic device test apparatus in a first embodiment of the present invention.

1 . . . electronic device test apparatus
10 . . . test head
50A . . . probe card
51 . . . mount base
52 . . . bonding wire
53 . . . support column
54 . . . limiter
55 . . . circuit board
55a . . . first through hole
55b . . . second through hole
55c . . . connector
55d . . . interconnect pattern
55e . . . terminals
56 . . . base member
57 . . . stiffener
60 . . . probe needle
61 . . . base part
62 . . . beam part
63 . . . conductive layer
80 . . . prober
83 . . . prober stage
W . . . semiconductor wafer

EMBODIMENTS OF INVENTION

Below, embodiments of the present invention will be explained based on the drawings.

Figure 2:
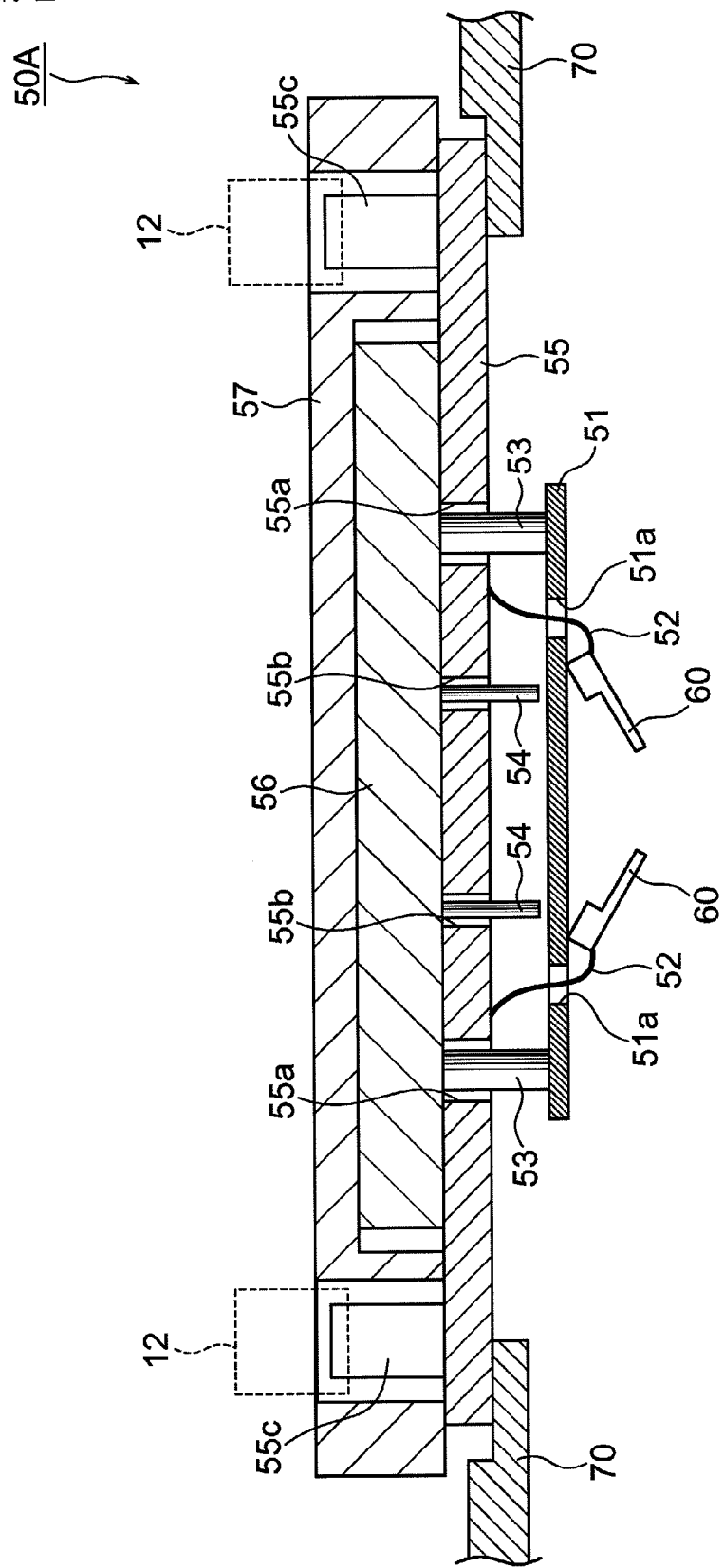
FIG. 2 is a cross-sectional view showing a probe card in a first embodiment of the present invention.
Figure 3:
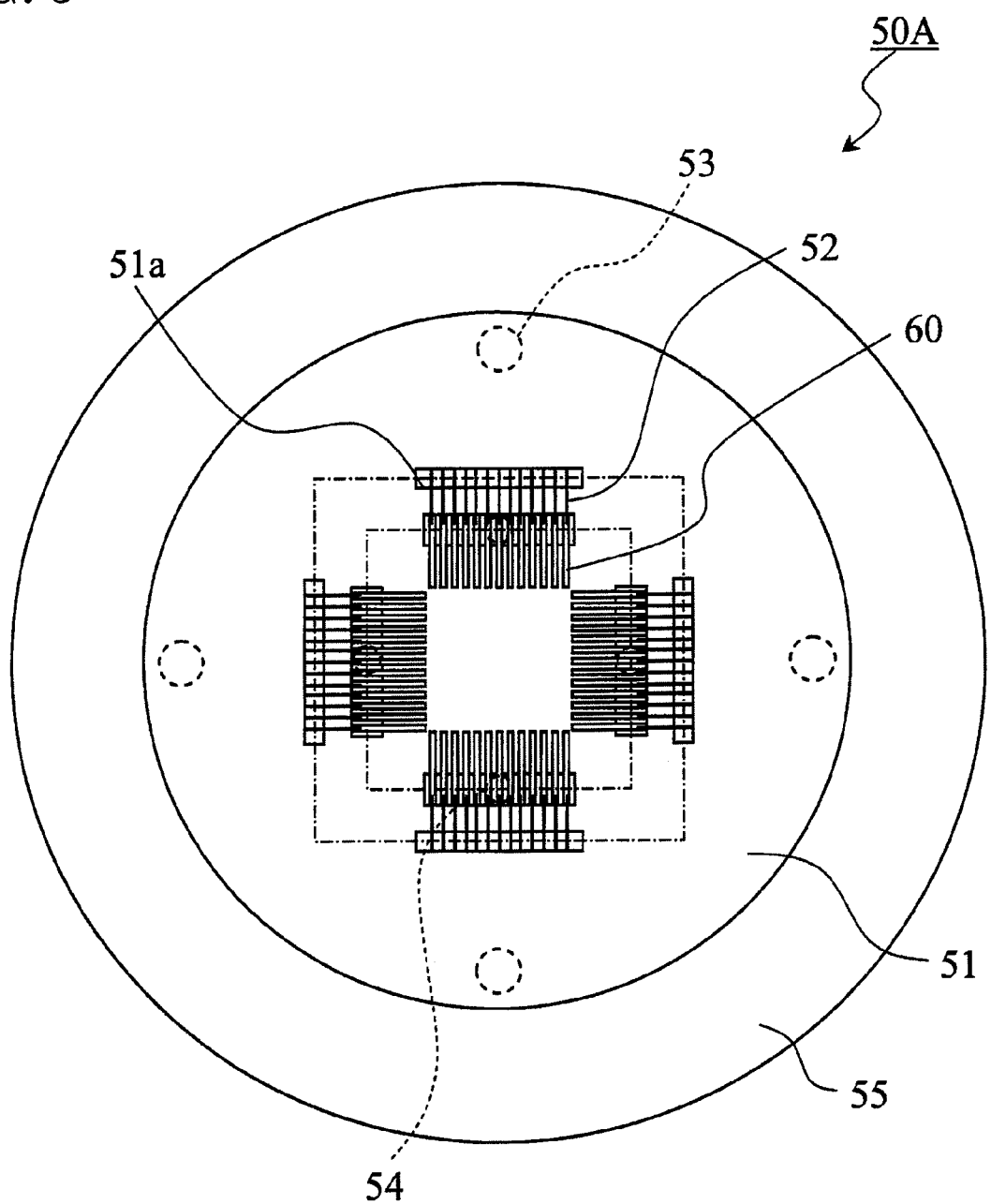
FIG. 3 is a bottom view showing a probe card in a first embodiment of the present invention.
Figure 4:
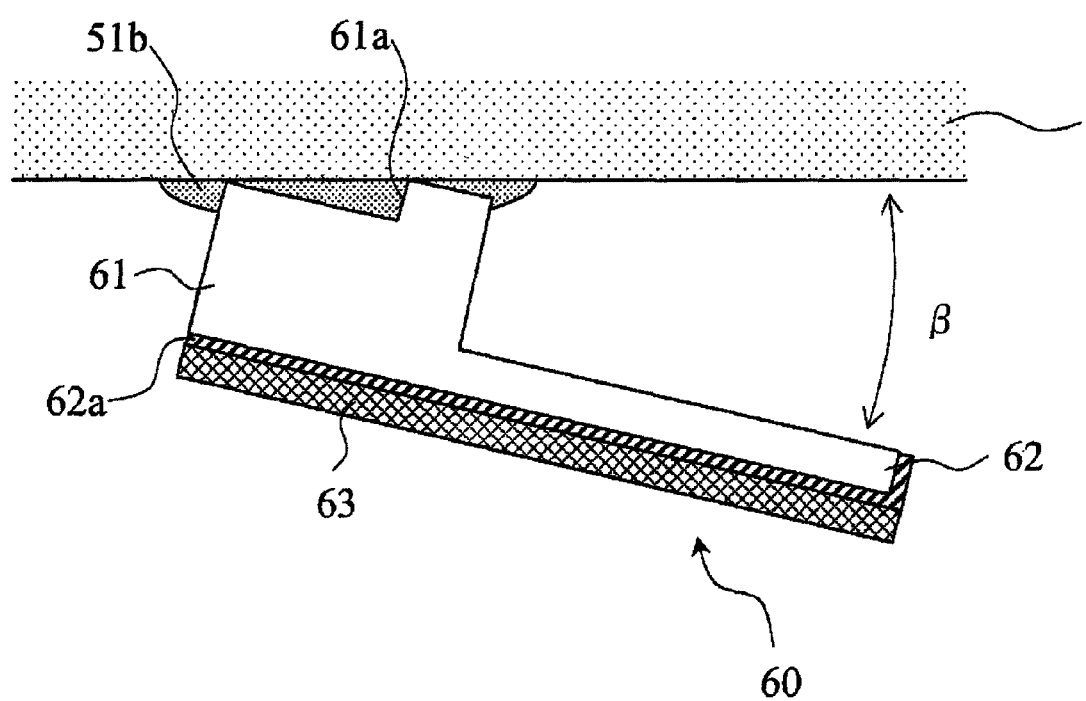
FIG. 4 is a cross-sectional view showing a probe needle in a first embodiment of the present invention.
Figure 5:
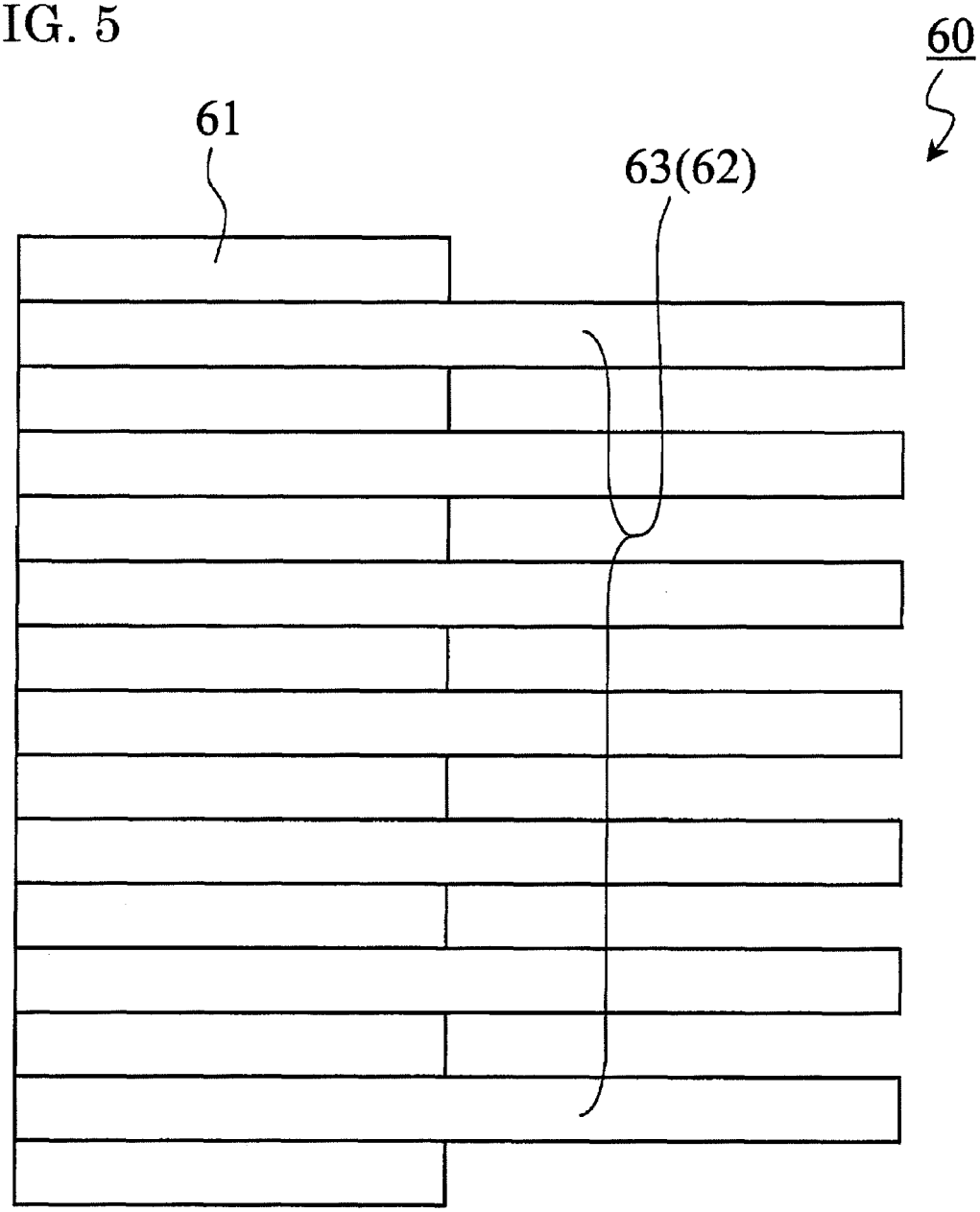
FIG. 5 is a plan view showing a probe needle in a first embodiment of the present invention.

FIG. 1 is a schematic cross-sectional view of an electronic device test apparatus in a first embodiment of the present invention, FIG. 2 is a cross-sectional view showing a probe card in a first embodiment of the present invention, FIG. 3 is a bottom view showing a probe card in a first embodiment of the present invention, FIG. 4 is a cross-sectional view showing a probe needle in a first embodiment of the present invention, and FIG. 5 is a plan view showing a probe needle in a first embodiment of the present invention.

The electronic device test apparatus 1 in the present embodiment is a apparatus for testing the electrical characteristics of an IC device built in a semiconductor wafer W made of for example silicon (Si). This electronic device test apparatus 1, as shown in FIG. 1, comprises: a test head 10 electrically connected to a tester (not shown) for testing the IC device via a cable (not shown); a probe card 50A for electrically connecting an IC device on the semiconductor wafer W and the test head 10; and a prober 80 pressing the semiconductor wafer W against the probe card 50A.

The probe card 50A, as shown in FIG. 1 to FIG. 3, comprises: a large number of probe needles 60 for electrically contacting input/output terminals of an IC device built into a semiconductor wafer W; a mount base 51 on which these probe needles 60 are mounted; a circuit board 55 having interconnect patterns (not shown) electrically connected to the probe needles 60 via bonding wires 52; a base member 56 and stiffener 57 for reinforcing the probe card 50A; support columns 53 supporting the mount base 51; and limiters 54 suppressing deformation of the mount base 51, and is connected via a HIFIX 11 to the test head 10.

The probe needles 60, as shown in FIG. 4 and FIG. 5, comprises: a base part 61 fixed to the mount base 51; beam parts 62 with rear end sides provided at the base part 61 and front end sides sticking out from the base part 61; and conductive layers 63 formed on the front surfaces of the beam parts 62. The base part 61 and beam parts 62 of the probe needles 60 are produced using photolithography or other semiconductor production technology from a silicon substrate. As shown in FIG. 5, a single base part 61 is provided with a plurality of beam parts 62 in finger shapes (comb shape). By using semiconductor production technology to produce probe needles 60, it is possible to easily match the pitch between the beam parts 62 with the narrow pitch between the input/output terminals built in the wafer W under test.

As shown in FIG. 4, a step 61a is formed at the rear end of the base part 61. By controlling the ratio of the depth and length of this step 61a, it is possible to freely set the slant angle β of the probe needles 50 with respect to the mount base 51. Note that, the smaller this slant angle β, the better.

An insulating layer 62a is formed on the top surfaces of the beam parts 62 for electrically insulating the conductive layer 63 from other parts in the probe needles 60. This insulating layer 62a is, for example, made of a $SiO_2$ layer or boron-doped layer.

The conductive layer 63 is formed on the surface of the insulating layer 62a. As the material composing the conductive layer 63, for example, tungsten, palladium, rhodium, platinum, ruthenium, iridium, nickel, or another metal material may be mentioned.

Such configured probe needles 60, as shown in FIG. 4, are fixed by an adhesive 51b on the mount base 51 and the front ends face input/output terminals of an IC device built into the wafer W under test. As the adhesive 51b fixing the probe needles 60 to the mount base 51, for example, an ultraviolet light curing adhesive etc. may be mentioned.

The mount base 51 is a circular board made of a material having a somewhat larger coefficient of thermal expansion than the wafer W under test. As specific materials composing the mount base 51, for example, ceramic, kovar, tungsten carbide, stainless invar steel, etc. may be mentioned. Note that, from the viewpoint of ease of processing and inexpensive price, it is preferable to compose the mount base 51 by a ceramic board. By making the mount base 51 out of a material having a suitable coefficient of thermal expansion with respect to the wafer W under test, it is possible to reduce fluctuations in the contact pressure of the probe needles 60 caused due to application of temperature and positional deviation between the front ends of the probe needles 60 and the terminals on the wafer W under test.

As shown in FIG. 2 and FIG. 3, rectangular through holes 51a running through the mount base 51 from the front surface to the back surface are formed behind the probe needles 60 in the mount base 51. Bonding wires 52 connected to the conductive layers 63 of the probe needles 60 are connected via the through holes 51a of the mount base 51 to terminals on the circuit board 55. The probe needles 60 and the circuit board 55 can be connected by bonding wires 52 given slack so as to allow the difference in thermal expansion of the mount base 51 and circuit board 55.

The circuit board 55 is a circular shaped board made of for example a glass epoxy resin. Terminals (not shown) to which bonding wires 52 are connected are formed at the bottom surface of the circuit board 55. Connectors 55c connected with the connectors 12 at the HIFIX 11 side are provided at the top surface of the circuit board 55. Interconnect patterns (not shown) electrically connecting the bottom surface terminals and top surface connectors 55c are formed inside the circuit board 55. As the connectors 12, 55c, for example, ZIF (Zero Insertion Force) connectors may be used. First through holes 55a for passing the support columns 53 and second through holes 55b for passing the limiters 54 are formed at the circuit board 55 so as to pass through from the front surface to the back surface.

A base member 56 and stiffener 57 are provided on the top surface of the circuit board 55 in order to reinforce the probe card 50A. The base member 56 and the stiffener 57 are fixed by for example bolting. Further, the stiffener 57 and the circuit board 55 are fixed at the outer peripheral part of the board 55 by for example bolting. On the other hand, the base member 56 and circuit board 55 are not directly fixed, so the circuit board 55 is unconstrained at its center part and deformation of the circuit board 55 due to heat expansion is not directly transmitted to the base member 56. As the material composing the base member 56 and stiffener 57, for example, stainless steel, carbon steel, etc. may be mentioned.

The support column 53 is a columnar member for supporting the mount base 51. As shown in FIG. 2, first ends of the support columns 53 are fixed to the mount base 51, while the other ends of the support columns 53 are directly fixed through the first through holes 55a to the base member 56. By directly fixing the support columns 53 to the base member 56, it is possible to prevent the effects of heat expansion of the circuit board 55 from causing fluctuation in position of the support columns 53. As the material composing the support columns 53, for example stainless invar steel etc. may be mentioned. As the technique for fixing the support columns 53 to the mount base 51 or base member 56, for example bolting, bonding, etc. may be mentioned.

The limiters 54 are columnar members for preventing deformation of the mount base 51 when pressing the wafer W against the probe needles 60. As shown in FIG. 2, first ends of the limiters 54 contact the back surface of the mount base 51 or are positioned near the back surface, while the other ends of the limiters 54 are directly fixed through the second through holes 55b to the base member 56. As the material composing the limiters 54, in the same way as the support columns 53, for example, stainless invar steel etc. may be mentioned. As the technique for fixing the limiters 54 to the base member 56, for example bolting, bonding, etc. may be mentioned. The limiters 54 are designed to closely contact the back surface of the mount base 51 and keep the mount base 51 from deforming to the circuit board 55 side when the wafer W is pressed against the probe card 50. Note that, when the mount base 51 has sufficient strength so as not to deform when pressing the wafer W against the probe needles 60, the limiters 54 are unnecessary.

The thus configured probe card 50A, as shown in FIG. 1, is fixed to a ring-shaped holder 70 in posture that the probe needles 60 face to lower side via the center opening 71. The holder 70 is fixed to a ring-shaped adapter 75 in a state holding the probe card 50A. Further, the adapter 75 is fixed to the opening 82 formed in the top plate 81 of the prober 80. This adapter 75 is for adapting a different size probe card due to the type of the wafer W under test and the shape of the test head 10 to the opening 82 of the prober 80. The probe card 50A side and the HIFIX 11 side, as shown in FIG. 1, are mechanically coupled by mutual engagement of hooks 13 provided at the bottom surface of the HIFIX 11 and hooks 76 provided at the adapter 75.

The HIFIX 11 is mounted at the bottom part of the test head 10. A connector 12 to which a coaxial cable is connected is provided at the bottom surface of this HIFIX 11. By connecting the connector 12 of the test head 10 side and the connector 55c provided at the top surface of the circuit board 55 of the probe card 50A, the test head 10 and the probe card 50A are electrically connected.

The prober 80 can hold a wafer W by a vacuum chuck and has a prober stage 83 enabling this held wafer W to be moved in the XYZ-directions. Further, this prober stage 83 can heat the wafer W under test being held.

Next, the actions will be explained.

At the time of the test, when a wafer W under test is carried on the prober stage 83, the prober stage 83 holds the wafer W by suction and starts the heating. At this time, in the present embodiment, the mount base 51 on which the probe needles 60 are mounted and the circuit board 55 on which the interconnect patterns are formed are separate in the probe card 50A, and the mount base 51 and circuit board 55 are not in contact, so even if the circuit board 55 expands by heat, that deformation will not be transmitted to the mount base 51.

Next, when the prober stage 83 presses the wafer W against the probe card 50A facing into the prober 80 via the opening 82, the probe needles 60 of the probe card 50A are electrically brought into contact with the input/output terminals of an IC device built in the wafer W. In this state, the tester inputs test signals via the test head 10 and probe card 50A to the IC device under test for receiving the output to test an IC device. At this time, as explained above, in the present embodiment, since the mount base 51 to which the probe needles 60 are mounted is configured to be hard to deform, fluctuation in the contact pressure of the probe needles 60 occurring due to temperature application and positional deviation between the front ends of the probe needles 60 and the terminals on the wafer W to be tested can be reduced.

Figure 6A:
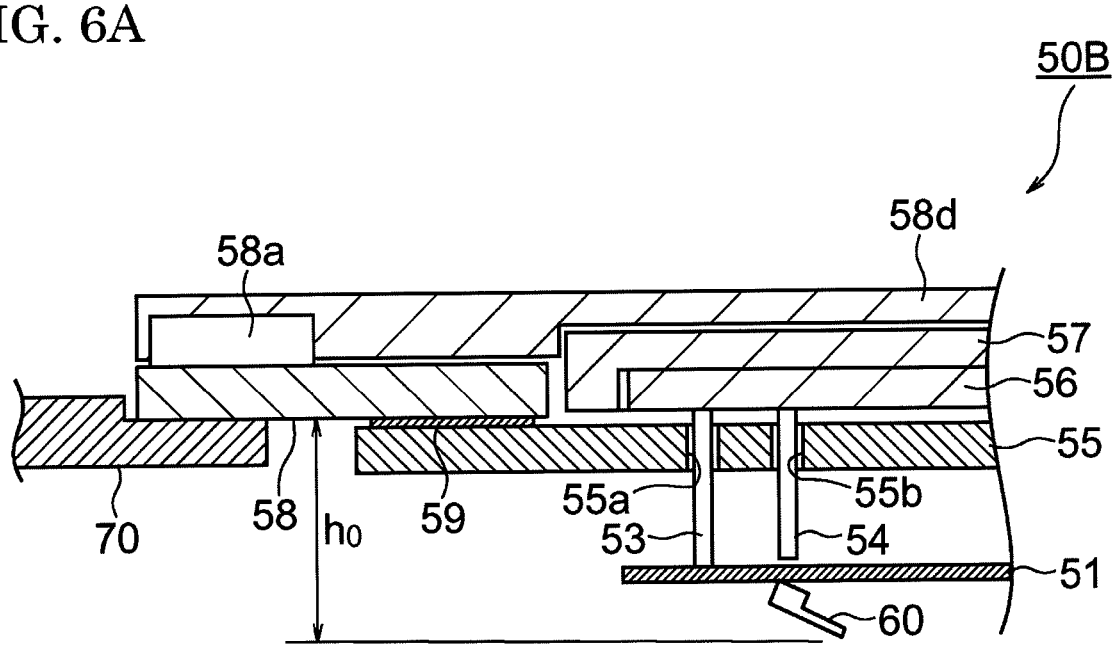
FIG. 6A is a partial cross-sectional view showing a probe card in a second embodiment of the present invention and shows an example of mounting a unit of a high height to the front ends of the probe needles.
Figure 6B:
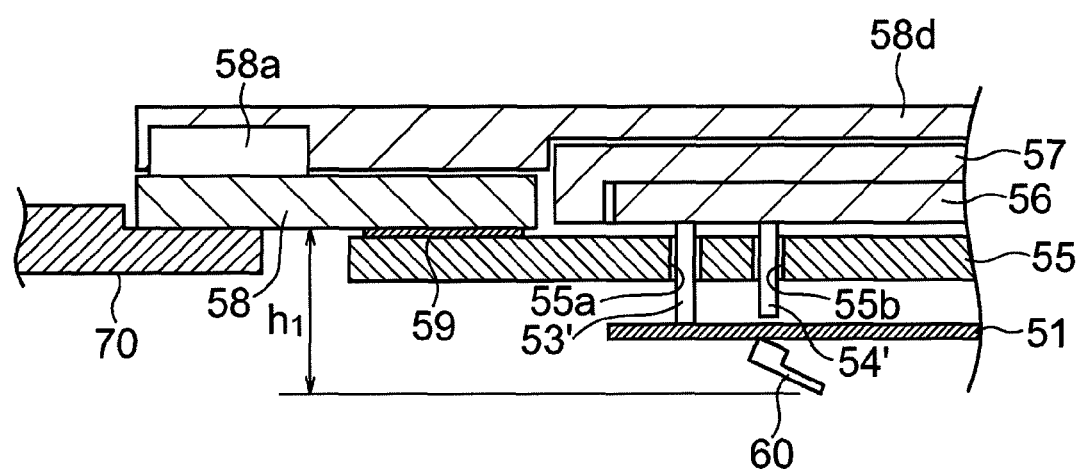
FIG. 6B is a partial cross-sectional view showing a probe card in a second embodiment of the present invention and shows an example of mounting a unit of a low height to the front ends of the probe needles.
Figure 7:
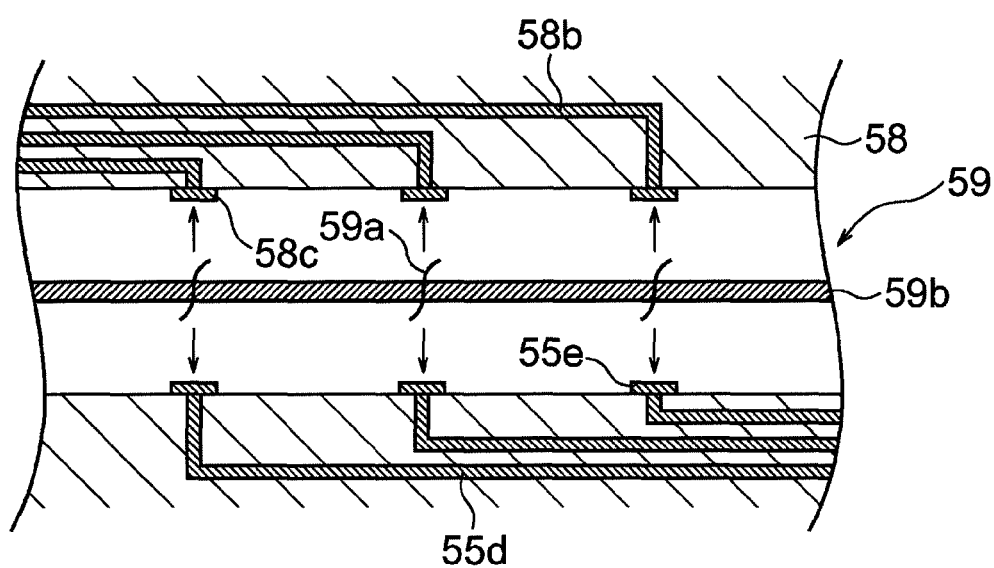
FIG. 7 is a cross-sectional view of an interposer used in a probe card in a second embodiment of the present invention.
Figure 8:
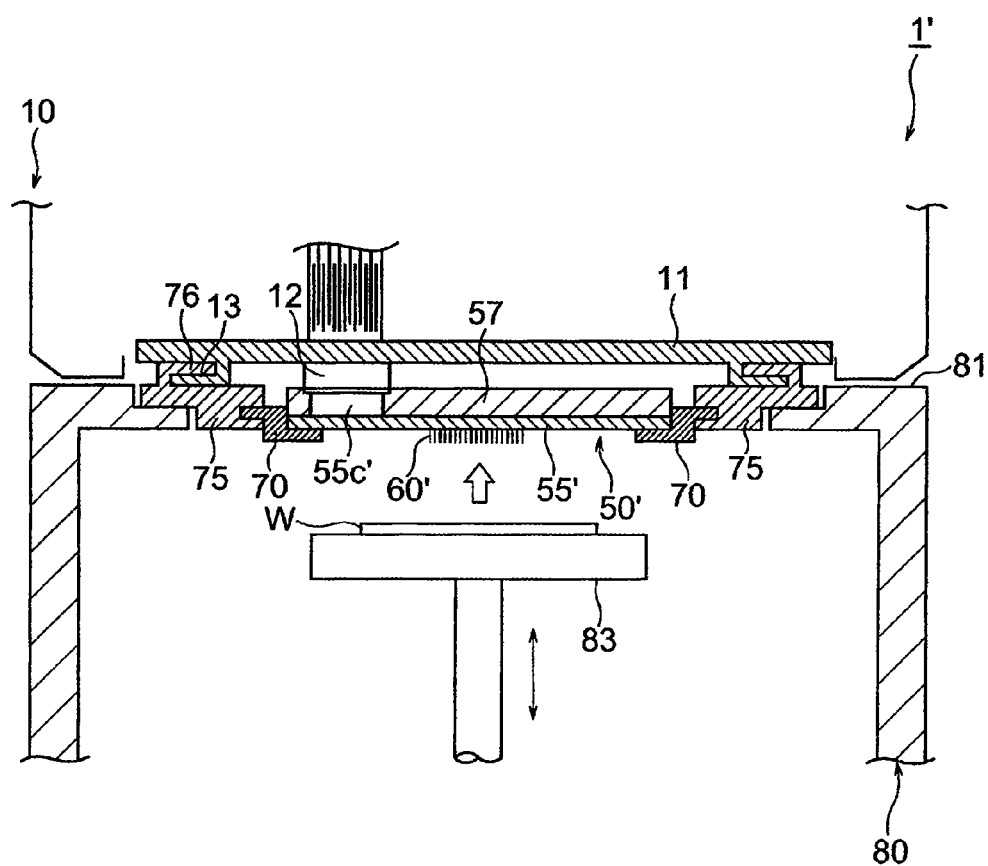
FIG. 8 is a schematic cross-sectional view showing the configuration of a conventional electronic device test apparatus.
Figure 9A:
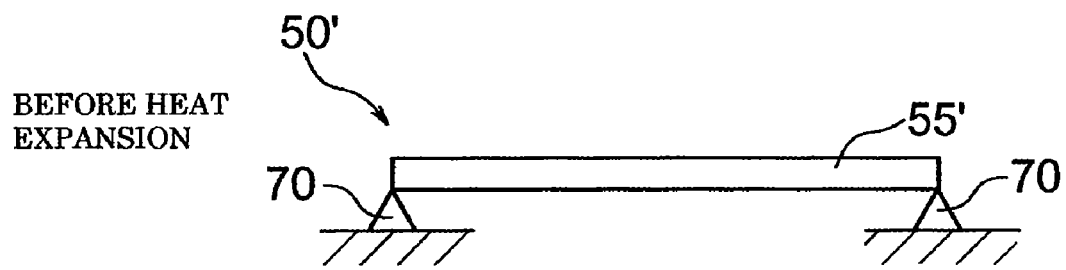
FIG. 9A is a schematic cross-sectional view showing the process of thermal expansion of a probe card (part 1).
Figure 9B:
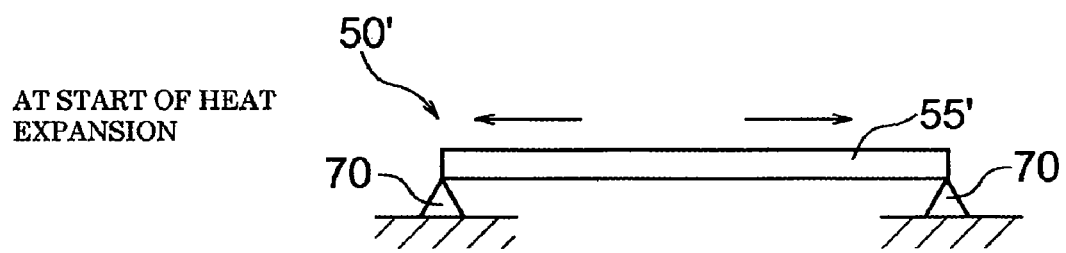
FIG. 9B is a schematic cross-sectional view showing the process of thermal expansion of a probe card (part 2).
Figure 9C:
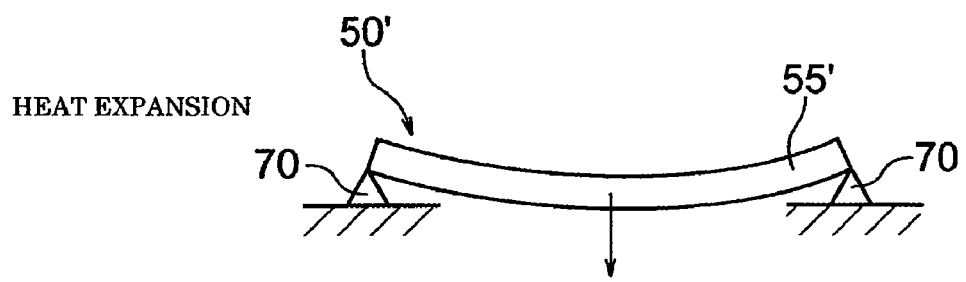
FIG. 9C is a schematic cross-sectional view showing the process of thermal expansion of a probe card (part 3).

FIG. 6A and FIG. 6B are partial cross-sectional views showing a probe card in a second embodiment of the present invention, and FIG. 7 is a cross-sectional view of an interposer used in a probe card in a second embodiment of the present invention.

The probe card 50B in the present embodiment, as shown in FIG. 6A, is similar to the first embodiment in the point of comprising a probe needle 60, a mount base 51, bonding wires 52, support columns 53, limiters 54, a circuit board 55, a base member 56, and a stiffener 57, but differs from the first embodiment in the configuration of the top surface of the circuit board 55 and in further comprising a fixing board 58 and an interposer 59.

As shown in FIG. 7, the circuit board 55 in the present embodiment is provided with, instead of the connector 55c, terminals 55e connected to the interconnect patterns 55d at its top surface. Incidentally, the interconnect pattern 55d is connected to terminals to which bonding wires 52 are connected at the bottom surface of the circuit board 55.

The fixing board 58 is, for example, a ring shaped board made of a glass epoxy resin. As shown in FIG. 7, the bottom surface of the fixing board 58 is provided with terminals 58c connected to the interconnect patterns 58b, while the top surface of the fixing board 58 is provided with connectors 58a coupled with connectors 12 of the HIFIX 11 side. Interconnection patterns 58b electrically connecting the terminals 58c and connectors 58a are formed inside the fixing board 58. As shown in FIG. 6A, a second stiffener 58d is fixed at the top part of fixing board 58. Further, a stiffener 57 to which the circuit board 55 is fixed is fastened to this second stiffener 58d.

The interposer 59, as shown in FIG. 7, comprises: a large number of pins 59a having elasticity; and a holding plate 59b holding these pins 59a at a substantial intermediate position. Due to these pins 59a, the terminals 55e of the circuit board 55 and the terminals 58c of the fixing board 58 and detachably electrically connected. Note that, as another example of an interposer, for example, pogo pins, an anisotropic conductive rubber sheet (silicone rubber in which fine metal plated wires are embedded in a high density), etc. may be mentioned. Instead of an interposer, connectors may also be used.

In the present embodiment, the unit comprising the mount base 51, support columns 53, limiters 54, and a circuit board 55 can be detached from the probe card 50B. By changing the unit, it is possible to change the height of the front ends of the probe needles 60.

For example, in the example shown in FIG. 6A, a unit having relatively high support columns 53 and limiters 54 is used, so the height of the front ends of the probe needles 60 from the bottom surface of the fixing board 59 is $h_0$. On the other hand, as shown in FIG. 6B, by replacing the unit with one having relatively low support columns 53' and limiters 54', it is possible to lower the height of the front ends of the probe needles 60 to $h_1$ ($h_0 > h_1$). Note that, not only by changing the heights of the support columns 53 and limiters 54, for example, it is also possible to change the thickness of the mount base 51 to change the height of the front ends of the probe needles 60.

Note that, the above explained embodiment was described for facilitating understanding of the present invention and was not described for limiting the present invention. Therefore, the elements disclosed in the above embodiment include all design changes and equivalents falling under the technical scope of the present invention.

The invention claimed is:

1. A connection board for electrically connecting a device under test and an electronic device test apparatus when testing the device under test, the connection board comprising:
    contactors for electrical connection with input/output terminals of the device under test;
    a first board on which the contactors are mounted;
    a second board having interconnect patterns electrically connected with the contactors;
    a support member supporting the first board;
    a first reinforcing member to which the support member is fixed; and
    a second reinforcing member which is fixed to the first reinforcing member and which is fixed to the second board at an outer peripheral part of the second reinforcing member, wherein
    the first board and the second board are not in contact with each other,
    a first through hole is formed in the first board and runs from a front surface of the first board to a back surface of the first board,
    the contactors and the interconnect patterns of the second board are electrically connected via bonding wires passing through the first through hole,
    the bonding wires are provided with slack,
    the first reinforcing member is interposed between the second board and the second reinforcing member, and
    the first reinforcing member is fixed to the second board via the second reinforcing member.

2. The connection board as set forth in claim 1, wherein the first board has a relatively small coefficient of thermal expansion compared with the second board.

3. The connection board as set forth in claim 1, wherein the first board has a relatively large coefficient of thermal expansion compared with a semiconductor substrate on which the device under test is formed.

4. The connection board as set forth in claim 1, wherein the first board is composed of a ceramic board.

5. The connection board as set forth in claim 1, wherein
    a second through hole is formed in the second board and runs from a front surface of the second board to a back surface of the second board,
    one end of the support member is fixed to the first board, and
    another end of the support member is fixed through the second through hole to the first reinforcing member.

6. The connection board as set forth in claim 1, further comprising a deformation suppressing member configured to suppress deformation of the first board to the second board side.

7. The connection board as set forth in claim 6, wherein
    a third through hole is formed in the second board and runs from a front surface of the second board to a back surface of the second board,
    one end of the deformation suppressing member is positioned in the vicinity of the first board, and another end of the deformation suppressing member is fixed through the third through hole to the first reinforcing member.

8. The connection board as set forth in claim 1, wherein the second board has a connector electrically connected to the electronic device test apparatus.

9. The connection board as set forth in claim 1, further comprising:
- a third board having a connector electrically connected to the electronic device test apparatus; and
- a intermediate board electrically connecting the second board and the third board in a detachable manner.

10. A probe card using the connection board as set forth in claim 1, wherein the device under test is a semiconductor device formed on a semiconductor wafer, and the contactors are probe needles mounted on the front surface of the first board and electrically connecting with input/output terminals of the semiconductor device.

11. An electronic device test apparatus for testing a semiconductor device formed on a semiconductor wafer, the electronic device test apparatus comprising:
- the probe card as set forth in claim 10;
- a test head electrically connected to the probe card; and
- a prober moving the semiconductor wafer relative to the probe card.

* * * * *